United States Patent [19]
Huang

[11] Patent Number: 5,989,956
[45] Date of Patent: Nov. 23, 1999

[54] DRAM CAPACITOR PROCESS

[75] Inventor: Heng-Sheng Huang, Taipei, Taiwan

[73] Assignee: United Microelectronics Corp., Taiwan

[21] Appl. No.: 08/814,377

[22] Filed: Mar. 11, 1997

Related U.S. Application Data

[60] Provisional application No. 60/014,190, Mar. 22, 1996.

[51] Int. Cl.$^6$ ............................................... H01L 21/8242
[52] U.S. Cl. ............................................ 438/254; 438/397
[58] Field of Search ..................................... 438/238, 239, 438/253, 254, 396, 397

[56] References Cited

U.S. PATENT DOCUMENTS

| | | | |
|---|---|---|---|
| 5,286,668 | 2/1994 | Chou | 437/52 |
| 5,789,291 | 8/1998 | Sung | 438/254 |

*Primary Examiner*—Joni Chang
*Attorney, Agent, or Firm*—Rabin & Champagne, P.C.

[57] ABSTRACT

A DRAM capacitor is formed by providing an opening to the surface of the drain of a memory cell's pass transistor. A first layer of polysilicon is deposited over the device and in contact with the drain of the pass transistor. Arsenic ions are implanted into the first layer of polysilicon and the first layer of polysilicon is annealed. A second layer of polysilicon is deposited over the first. Phosphorus ions are implanted into the surface of the second layer of polysilicon. A mask is formed over the two polysilicon layers, and the two layers are etched to define the lateral extent of the memory cell capacitor's lower electrode. An etch that preferentially etches doped polysilicon is used to laterally etch the (doped and annealed) first polysilicon layer, thereby undercutting the second polysilicon layer. The second polysilicon layer is then annealed. A dielectric film is formed on the surface of the lower electrode and an upper electrode consisting of doped polysilicon is formed over the surface of the dielectric layer. Forming a DRAM capacitor in this manner prevents impurities implanted into the polysilicon lower electrode of the capacitor from diffusing into the substrate in a manner which could expand the size of the drain region.

10 Claims, 3 Drawing Sheets

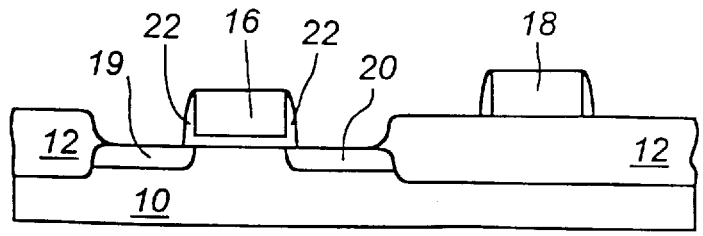
FIG. 1 - Prior Art
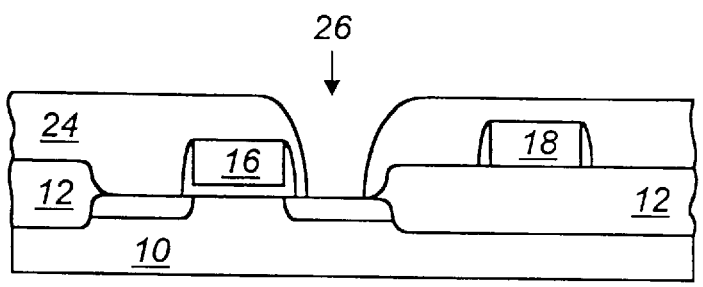
FIG. 2 - Prior Art
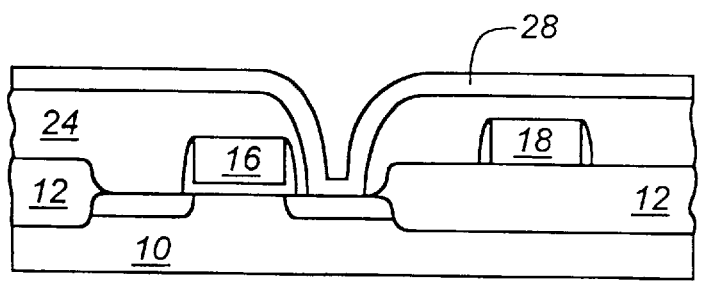
FIG. 3 - Prior Art

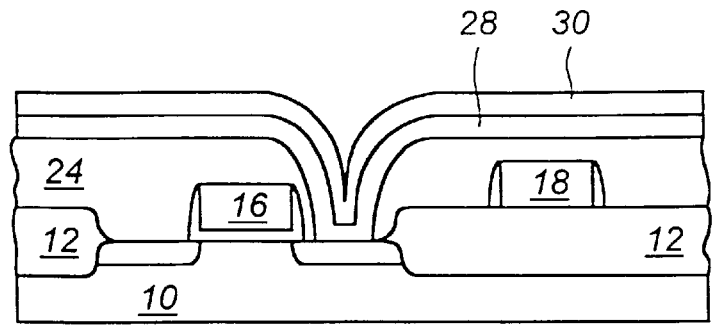
FIG. 4 - Prior Art
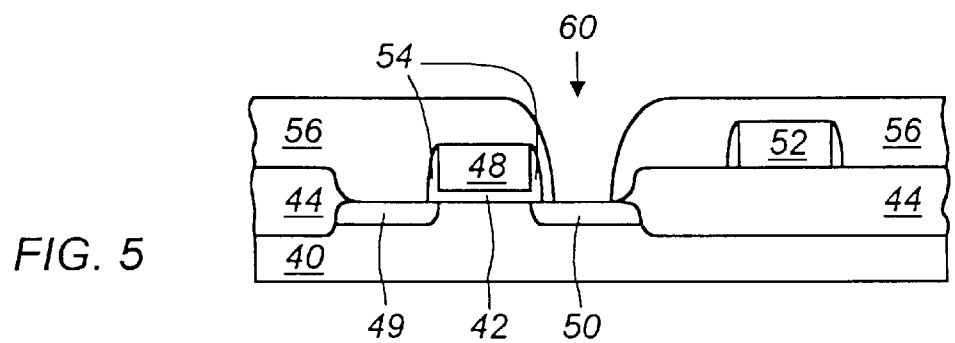
FIG. 5
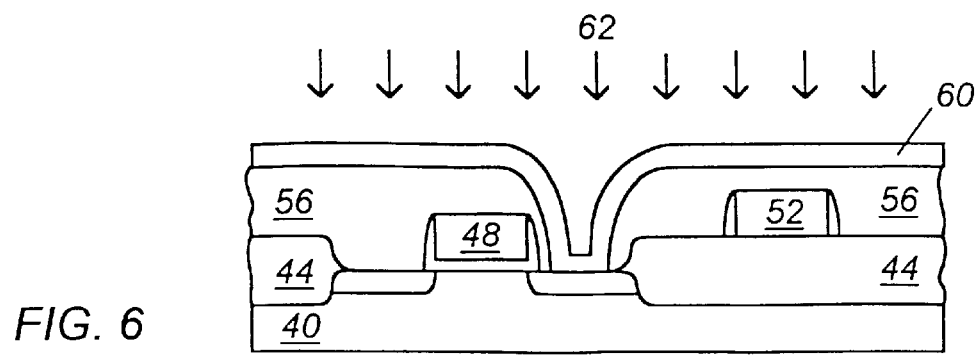
FIG. 6

DRAM CAPACITOR PROCESS

This application claims priority from provisional application Ser. No. 60/014,190, filed Mar. 22, 1996.

BACKGROUND OF THE INVENTION

1. Field of the Invention

The present invention relates to the formation of capacitor structures over doped regions within semiconductor devices and, more particularly, to the formation of capacitor devices that store charge within dynamic random access memory devices.

2. Description of the Related Art

Further reductions in the size of memory cells within dynamic random access memory (DRAM) devices, and corresponding increases in the storage density of DRAMs, present a variety of challenges related to the reduced dimensions of the structures within the memory cell and in the increased processing difficulty associated with making such small structures. The typical DRAM memory cell consists of a charge storage capacitor electrically connected to the drain of a "pass" MOS transistor. The pass transistor acts as a switch for selectively coupling the charge storage capacitor to the memory cell's signal lines during data read out or write processes to respectively discharge or charge the capacitor. As DRAM memory cells are made smaller, efforts are made to reduce the size of the pass transistor and the capacitor, while maintaining the capacitance of the capacitor and thus keep constant the amount of charge stored in the memory cell. Consequently, as memory cell sizes decrease, the same amount of charge will flow through smaller and smaller pass transistors. Electrical field effects, including the short channel effect, become accentuated in such reduced-dimension pass transistors and become increasingly problematic when typical stored charge levels flow through such small pass transistors.

To reduce the difficulties associated with reduced-dimension pass transistors, it is desirable to manage the doping level and doping profile of the source and drain regions of the pass transistor. One frequently implemented strategy is the use of lightly doped drain (LDD) profiles for both the source and drain regions of the pass transistors. The adoption of such designs may not, however, ensure desired doping profiles in small source/drain regions because the dopants diffuse away from these regions when the device is subjected to high temperature processing steps after the formation of the source/drain regions. This problem is compounded when a DRAM capacitor is formed on the drain of the pass transistor by providing layers of doped polysilicon in contact with the drain region of the pass transistor. Such layers may be formed by depositing polysilicon over the memory cell region in contact with the drain region, implanting ions into the polysilicon, and then annealing the device to activate the implanted impurities and to render the polysilicon layer conductive. During this process, dopants from the polysilicon layer can diffuse into the substrate, creating a deeper and broader drain region than is desirable.

One strategy for addressing the problem of dopants diffusing from the polysilicon bottom electrodes of capacitors into the drain region is illustrated in FIGS. 1–4. FIGS. 1–4 show cross-sectional views of a portion of a DRAM memory cell at an early stage of manufacture. The illustrated memory cell is formed on a P-type substrate 10 and includes thick field oxide regions 12 to provide isolation from other, adjacent memory cells. A gate oxide layer 14 is formed by thermal oxidation on part of the active device region of the illustrated memory cell and a polysilicon gate electrode 16 is formed on the gate oxide layer 14. The polysilicon gate electrode 16 is formed by depositing a layer of undoped polysilicon over the substrate, typically using low pressure chemical vapor deposition (LPCVD), patterning the polysilicon using photolithography and then implanting impurities into the polysilicon and activating the impurities to render the gate electrode conductive. Polysilicon wiring line 18 is formed on the field oxide region 12 at the same time as the gate electrode 16.

Doped source/drain regions 19, 20 are formed on either side of the polysilicon gate electrode to define the channel region of the memory transistor. Generally, a lightly doped drain (LDD) structure is used in small design rule memory transistors of the type that are primarily used in modern memory and logic devices. LDD source/drain regions 19, 20 are typically formed in a two step process, beginning with a relatively low level dopant implantation made self-aligned to a polysilicon gate electrode 16. Subsequently, spacer oxide regions 22 are formed on either side of the gate electrode by first depositing a layer of CVD oxide over the device and then anisotropically etching back the oxide layer to expose the substrate over the source/drain regions 19, 20. Etching back the CVD oxide layer produces the spacer oxide regions 22 on either side of the polysilicon gate electrode 16 and on either side of the polysilicon wiring line 18. After the spacer oxide regions 22 are provided on either side of the polysilicon gate electrode 16, a second, heavier ion implantation is made into the source/drain regions 19, 20, self-aligned to the spacer oxide regions 22.

After the formation of the pass transistor of the memory cell, including the gate electrode 16 and the source/drain regions 19, 20, a layer 24 of insulation such as silicon oxide is deposited by chemical vapor deposition (CVD). An opening 26 is then formed by lithography through the layer 24 to expose the drain region 20 of the substrate, as shown in FIG. 2. Referring now to FIG. 3, a layer of undoped polysilicon 28 is deposited by low pressure chemical vapor deposition (LPCVD) over the surface of the device and within the opening 26 in contact with drain region 20. Layer 28 will form part of the lower electrode of the charge storage capacitor for the DRAM memory cell. A thin layer of native oxide, on the order of 3–4 Å (not shown), is grown on the surface of polysilicon layer 28. Next, as shown in FIG. 4, a second layer 30 of polysilicon is deposited on the first undoped polysilicon layer 28. This layer is heavily doped with arsenic or phosphorus ions either in situ during the deposition process or by ion implantation. The native oxide layer over the surface of the first polysilicon layer 28 traps impurities during the implantation process so that the first polysilicon layer 28 remains substantially undoped. A subsequent anneal will cause impurities to diffuse through the polysilicon layers. By this process, relatively few dopants will diffuse into the drain region 20, so that the junction between the drain region 20 and the substrate 10 remains shallow. Subsequent processing patterns the two polysilicon layers 28, 30 to shape the bottom electrode, deposits an inter-electrode dielectric layer, and forms a doped polysilicon upper electrode.

The process illustrated in FIGS. 1–4 forms a conductive lower electrode for a charge storage capacitor in a manner that introduces relatively few additional impurities into the drain region 20. This structure, however, provides a lower electrode that is undesirably resistive. Such resistance internal to the capacitor can slow data read out and cause the loss of data. It is accordingly desirable to provide an improved process for forming a charge storage capacitor consistent with the formation of shallow junction source/drain regions for a DRAM cell's pass transistor.

BRIEF DESCRIPTION OF THE DRAWINGS

FIGS. 1–4 illustrate process steps for forming a DRAM cell in accordance with conventional teachings.

FIGS. 5–10 illustrate stages in the manufacture of a DRAM formed in accordance with the present invention.

SUMMARY OF THE PREFERRED EMBODIMENTS

Figure 7:
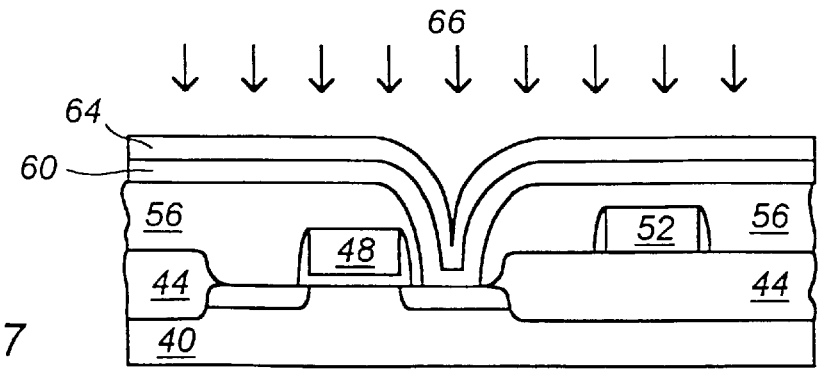

One aspect of the present invention provides a method of making a memory device including a charge storage capacitor, comprising the steps of providing a substrate having a transistor having source/drain regions formed on a surface of the substrate, and having a gate electrode formed above the surface of the substrate. The capacitor is formed by depositing a first polysilicon layer over the transistor and in contact with a source/drain region of the transistor and doping the first polysilicon layer with an impurity and annealing the first polysilicon layer. A second polysilicon layer is deposited on the surface of the first polysilicon layer after the first polysilicon layer is annealed.

A further aspect of the present invention includes steps of implanting ions into the surface of the second polysilicon layer and selectively etching the first polysilicon layer to undercut the second polysilicon layer.

A different further aspect of the present invention includes the steps of implanting ions into the second polysilicon layer and subsequently annealing the second polysilicon layer to activate the ions within the second polysilicon layer. Particular embodiments of this further aspect include the steps of forming a mask over the first and the second polysilicon layers and etching the second polysilicon layer and etching the first polysilicon layer to laterally define a lower electrode of a capacitor. The step of etching the first polysilicon layer may continue in such a manner to undercut the second polysilicon layer and then annealing the second polysilicon layer. In either case, the method continues by forming a dielectric layer over a surface of the lower electrode and forming an upper layer of doped polysilicon over the dielectric layer and patterning the upper layer of doped polysilicon to form an upper electrode of the capacitor.

DETAILED DESCRIPTION OF THE PREFERRED EMBODIMENTS

Preferred embodiments of the present invention form the lower electrode of a charge storage capacitor for a memory device from polysilicon deposited in contact with the surface of the substrate above the source/drain region of a memory transistor. The lower electrode is formed in a manner that provides a capacitor having reduced internal resistance and which does not appreciably alter the depth of the junction between the memory transistor's source/drain region and the substrate. Particularly preferred embodiments of the present invention provide a charge storage capacitor having a lower electrode incorporating a lower polysilicon layer doped with a relatively immobile dopant. An upper polysilicon layer, which may be doped with a more mobile dopant, is formed on the lower electrode so as to extend laterally past the lower polysilicon layer, to complete the lower electrode. A dielectric layer is provided over the lower electrode and an upper electrode is formed in contact with the dielectric layer to complete the charge storage capacitor. In preferred embodiments, dopant extends throughout the lower electrode, allowing the lower electrode to have a relatively low resistance. Dopant within the upper polysilicon layer diffuses into the lower layer at a relatively low rate due to the concentration of dopants already present in the lower polysilicon layer, even during subsequent thermal processing steps.

A capacitor in accordance with the present invention may be formed by providing an insulating layer over a transistor of a memory cell and providing an opening through the insulating layer down to a source/drain region of the transistor. A first layer of polysilicon is deposited over the device so as to make contact with the source/drain region. This first layer is preferably doped with arsenic, which is a relatively immobile dopant that tends not to diffuse particularly far within the crystalline substrate. In particularly preferred embodiments, the first layer is doped by implantation and is annealed to activate the arsenic within the layer before further processing. A second layer of polysilicon is deposited on the first layer and, preferably, phosphorus is implanted into the surface of the second layer of polysilicon. A mask is formed to define the lateral extent of the lower electrode, and the second and first layers of polysilicon are anisotropically etched. In particularly preferred embodiments, a second, isotropic etch is performed that selectively etches doped polysilicon while leaving undoped polysilicon relatively unetched. Since the phosphorus implantation is limited to the surface of the second layer of polysilicon, such a selective etch would primarily etch the first polysilicon layer, undercutting the second layer so that the second layer extends laterally beyond the first polysilicon layer. The impurities within the second layer are then activated by annealing, which causes the impurities to diffuse through second polysilicon layer. Further processing continues to provide the inter-electrode dielectric layer and the upper electrode of the capacitor.

A more detailed description of a preferred process for forming a capacitor in accordance with the present invention is now presented with reference to FIGS. 5–10. Preferred embodiments of the present invention may be used to form charge storage capacitors within DRAMs. A DRAM cell at an early stage in the manufacturing process is illustrated in cross-section in FIG. 5. A gate oxide layer 42 and field oxide (FOX) regions 44 are formed on a P-type silicon substrate 40. Transistor device 46 has a gate electrode 48 and N-type source/drain regions 49, 50. The source/drain regions 49, 50, the gate oxide layer 42, field oxide regions 44, the gate electrode 48 and wiring line 52 are all formed by conventional processing techniques well known to those skilled in the art. For example, the process for forming the transistor 46 can include the deposition of a doped polysilicon layer on gate oxide 42 and field oxide regions 44. The polysilicon layer is then patterned by photolithography and etching to form a gate electrode 48 above gate oxide 42 and a wiring line 52 on field oxide region 44. An ion implantation process is used to form lightly doped N-type regions in P-type substrate 40, self-aligned to the gate electrode 48 and to the field oxide regions 44. Then oxide spacers 54 are formed next to the gate electrode 48 to prevent heavy doping of the lightly doped N-type regions immediately adjacent to the gate electrode 48. Source/drain regions 49, 50 are formed by self-aligned ion implantation on either side of gate electrode 48 using the oxide spacers 54 and the field oxide regions 44 as a mask.

A blanket layer 56 of silicon dioxide having a thickness of between about 2000 Å to about 4000 Å is deposited, preferably by CVD, over the gate electrode 48, source/drain regions 49, 50, spacers 54, field oxide regions 44 and wiring line 52. A layer of photoresist is formed over the blanket layer 56 of silicon dioxide, and photolithography is used to define a mask over the oxide layer 56, and an opening 58 is formed over the source/drain region 50 of the transistor 46. Referring to FIG. 6, a first polysilicon layer 60 having a thickness between about 500 Å and about 1,500 Å is deposited over the oxide layer 56 using LPCVD. Layer 60 is preferably doped by ion implantation with arsenic (As) ions 62 at a preferred energy of between about 60 KeV to 80 KeV, to a dose of about $5 \times 10^{15}$ atoms/cm$^2$. Arsenic is particularly preferred as a dopant because of its comparative immobility. Antimony might be expected to provide similar characteristics with regard to dopant mobility. Most preferably, the device is annealed to activate the arsenic ions before the second polysilicon layer is deposited. An appropriate anneal may consist of a rapid thermal anneal (RTA) performed at a temperature of about 1100° C. for about 10 seconds or a slower anneal might alternately be performed at a temperature of about 800° C. for twenty to sixty minutes.

A second polysilicon layer 64 (FIG. 7) having a thickness of between about 500 Å and about 1,500 Å is deposited on the first polysilicon layer 60. Preferably, any native oxide grown on the surface of the first polysilicon layer 60 is removed before the second polysilicon layer is deposited by dipping the device in a dilute HF solution. To minimize the regrowth of native oxide, it is preferred that the second polysilicon layer be deposited within about three hours of the HF dip. After deposition, the surface of the second polysilicon layer 64 is doped by implanting impurities, for example, phosphorus ions 66 at a preferred energy of between about 30 KeV to 100 KeV, to a dose of about $1 \times 10^{16}$ atoms/cm$^2$. No anneal is performed at this step in preferred embodiments of the present invention.

Figure 8:
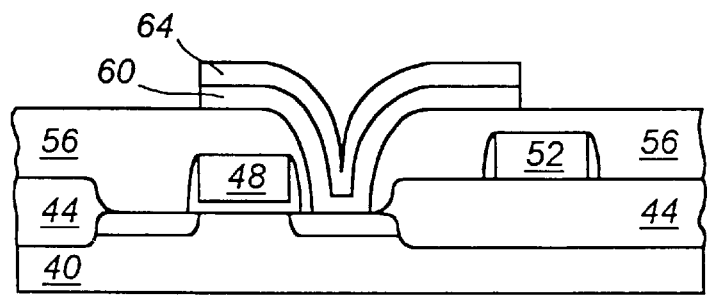

A layer of photoresist is deposited and patterned on top of the second polysilicon layer 64 to form a mask that is used to laterally define the capacitor structure. Dry etching is used to etch the polysilicon layers 60, 64 exposed by the photoresist mask. A well-suited etching environment is the P5000 etcher manufactured by Applied Materials Corporation, although similar etching systems can also be used. The main etching process may be performed using a chlorine based plasma, for example, created from a flow of $Cl_2$ gas at a rate of 60 to 100 sccm and preferably about 70 sccm of $Cl_2$ gas flow. It may be useful to add a bromine-containing gas such as HBr to the chlorine gas flow during the etching of the second polysilicon layer 64, but it is particularly preferred that no bromine be present in the etch plasma once etching of the first polysilicon layer begins. Etching proceeds through the undoped body of the polysilicon layer 64 in an anisotropic manner driven by ions accelerated by the etching system. The pressure within the etch chamber is maintained at a pressure of between about 70 to 100 mTorr and preferably about 80 mTorr. After vertically etching through the first and second polysilicon layer 60, 64, the layers of differently doped polysilicon become exposed along their edges, as is shown in FIG. 8. Lateral etching of the first polysilicon layer begins during the main etch process and continues in an overetching process. Overetching to undercut the second polysilicon layer through the more highly doped first polysilicon layer 60 uses the same gas composition (chlorine), flow rate and pressure as is used in the main etching process.

Figure 9:
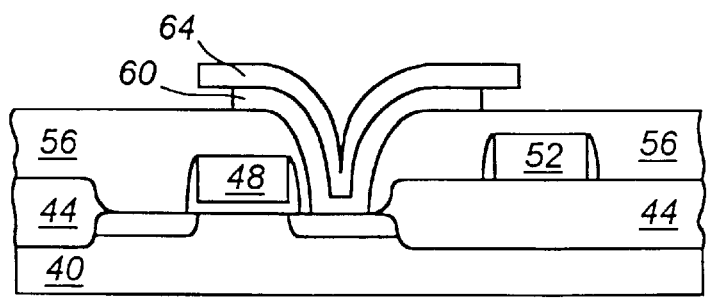
Figure 10:
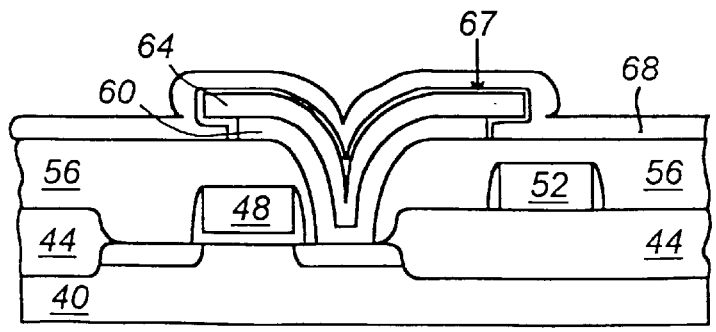

FIG. 9 shows the capacitor structure after the etching and the lateral definition of the capacitor is complete. Lateral etching of the first polysilicon layer 60 proceeds, in particularly preferred embodiments, using an isotropic plasma etching process which is selective to doped polysilicon, i.e., doped polysilicon is etched more rapidly than lightly doped or undoped polysilicon. Doped polysilicon can be etched in a substantially isotropic manner by using a chlorine-based plasma. The first polysilicon layer 60 is doped to a significant level with arsenic and thus is more sensitive to the chlorine ions generated in the $Cl_2$ plasma and so is readily etched by the plasma. The second polysilicon layer 64 has a low doping level through its body, since the phosphorus implantation is concentrated on the surface of the layer and the surface is covered by a photoresist mask. Thus, the second polysilicon layer 64 presents a relatively low doping level through its body and is relatively more resistant to etching by the chlorine plasma than is the first polysilicon layer 60.

Processing continues by annealing the device to cause the phosphorus ions within the second polysilicon layer 64 to diffuse through the layer and to activate the dopants. This annealing step might, for example, consist of a rapid thermal anneal at a temperature of about 1100° C. for about 10 seconds. Phosphorus diffuses readily through polysilicon, and some of the phosphorus will diffuse from the second polysilicon layer 64 into the first polysilicon region 60 during this annealing step and in subsequent thermal processing steps. The rate of phosphorus diffusion will, however, be limited by the presence of annealed arsenic within the first polysilicon layer 60. Thus, a limited amount of phosphorus will diffuse through the first layer of polysilicon 60 and a lesser amount of phosphorus will diffuse into the source/drain region 50 so that the source/drain region likely will not expand undesirably. Processing continues by forming a dielectric layer 67 on the exposed surfaces of the first and second polysilicon layers, shown in FIG. 10 as a thin layer on the surface of the lower electrode to indicate the thin (30–150 Å) layer formed. An appropriate dielectric layer can be formed by depositing a layer of silicon nitride, for example by CVD, and then growing a thin oxide layer on the surface of the silicon nitride layer. Often, this "NO" layer is formed on top of an oxide layer, such as a native oxide layer covering the surface of the polysilicon lower electrode, so that the actual dielectric film formed has an "ONO" structure. More preferably, the native oxide on the surface of the bottom electrode is removed by dipping the device in a dilute HF solution. Then the dielectric layer formed has an "NO" structure. Finally, a polysilicon layer 68 is deposited by LPCVD over the device (FIG. 10), and then the polysilicon layer 68 is doped by ion implantation and patterned to form an upper electrode for the capacitor. Further conventional processing is performed to complete the DRAM device.

The present invention has been described in terms of certain preferred embodiments. The invention is not, however, limited to the specific embodiments described, but also includes such modifications and variations as fall within the scope of the following claims.

What is claimed:

1. A method of making a memory device including a charge storage capacitor, comprising the sequential steps of:

providing a substrate having a transistor having source/drain regions formed on a surface of the substrate, and having a gate electrode formed above the surface of the substrate;

depositing a first polysilicon layer over the transistor and in contact with a source/drain region of the transistor;

doping the first polysilicon layer with an impurity and annealing the first polysilicon layer;

depositing a second polysilicon layer on a surface of the first polysilicon layer after the first polysilicon layer is annealed;

implanting ions into the surface of the second polysilicon layer; and selectively etching the first polysilicon layer to undercut the second polysilicon layer.

2. The method of claim 1, further comprising the steps of implanting ions into the second polysilicon layer and subsequently annealing the second polysilicon layer to activate the ions within the second polysilicon layer.

3. The method of claim 2, wherein the impurity within the first polysilicon layer comprises either arsenic or antimony.

4. The method of claim 3, wherein the ion within the second polysilicon layer is phosphorus.

5. The method of claim 4, wherein the first polysilicon layer and the second polysilicon layer are simultaneously annealed with a rapid thermal anneal.

6. The method of claim 5, further comprising the steps of:

forming a mask over the first and the second polysilicon layers;

etching the second polysilicon layer and etching the first polysilicon layer to laterally define a lower electrode of a capacitor.

7. The method of claim 6, wherein the step of etching the first polysilicon layer continues in such a manner to undercut the second polysilicon layer.

8. The method of claim 7, further comprising the steps of:

forming a dielectric layer over a surface of the lower electrode; and forming an upper layer of doped polysilicon over the dielectric layer and patterning the upper layer of doped polysilicon to form an upper electrode of the capacitor.

9. The method of claim 1, wherein subsequent to the selective etching of the first polysilicon layer, the second polysilicon layer is annealed to activate the ions within the second polysilicon layer.

10. The method of claim 9, wherein the ion within the second polysilicon layer is phosphorus and wherein the impurity within the first polysilicon layer is arsenic.

* * * * *